(12) United States Patent
Kajiwara et al.

(10) Patent No.: US 6,346,038 B1
(45) Date of Patent: Feb. 12, 2002

(54) WAFER LOADING/UNLOADING DEVICE AND METHOD FOR PRODUCING WAFERS

(75) Inventors: Jiro Kajiwara; Yoshie Kaido; Masahito Komasaki, all of Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/461,329

(22) Filed: Dec. 15, 1999

(30) Foreign Application Priority Data

Dec. 15, 1998 (JP) .......................................... 10-356753
Dec. 15, 1998 (JP) .......................................... 10-356754

(51) Int. Cl.[7] .............................................. B24B 47/02
(52) U.S. Cl. ........................ 451/339; 451/41; 451/288; 451/391
(58) Field of Search ................................. 451/339, 285, 451/287, 288, 385, 397, 391, 41

(56) References Cited

U.S. PATENT DOCUMENTS

| 5,038,524 A | * | 8/1991 | Moulin ........................ 451/288 |
| 5,094,037 A | * | 3/1992 | Hakomori et al. .......... 451/339 |
| 5,639,388 A | * | 6/1997 | Kimura et al. .............. 451/287 |
| 5,660,581 A | * | 8/1997 | Shin et al. .................. 451/339 |
| 5,672,095 A | * | 9/1997 | Morimoto et al. .......... 451/288 |
| 5,860,847 A | * | 1/1999 | Sakurai et al. .............. 451/288 |
| 5,904,609 A | * | 5/1999 | Fukuroda et al. ............ 451/41 |
| 6,139,408 A | * | 10/2000 | Hakomori .................... 451/339 |
| 6,142,857 A | * | 11/2000 | Cesna ......................... 451/287 |
| 6,196,906 B1 | * | 3/2001 | Hakomori .................... 451/339 |

* cited by examiner

Primary Examiner—Derris H. Banks
Assistant Examiner—Lee Wilson
(74) Attorney, Agent, or Firm—Oblon, Spivak, McClelland, Maier & Neustadt, P.C.

(57) ABSTRACT

A wafer loading/unloading device and a method for producing wafers in which positioning and mounting can be effected in a stable manner when attaching the wafer to the polishing head and which make it possible to receive or transfer the polished wafer in a stable manner. The wafer loading/unloading device includes a main body portion for supporting a wafer W, a swinging shaft supporting a swinging arm connected to the main body portion, and an arm ascending/descending mechanism supporting the swinging arm such that it can ascend and descend. The main body portion is equipped with a wafer support portion and an action force absorbing mechanism for absorbing vertical force acting on the wafer support portion, so that the impact when attaching or detaching the wafer to or from the polishing head is mitigated. Thus, damage to the wafer and the polishing head is prevented and the wafer is transferred in a stable manner.

18 Claims, 11 Drawing Sheets

WAFER LOADING/UNLOADING DEVICE AND METHOD FOR PRODUCING WAFERS

BACKGROUND OF THE INVENTION

1. Field of the Invention

The present invention relates to a wafer loading/unloading device which attaches a wafer to be polished to a polishing head and which receives the wafer that has undergone polishing on the polishing head from the polishing head, and to a method of producing wafers by using this apparatus.

2. Description of the Related Art

Generally speaking, in a wafer polishing apparatus for polishing the surface of semiconductor wafers, a wafer polishing head holding the wafer and a platen to which a polishing pad is attached are opposed to each other, and polishing is effected by causing the wafer polishing head to make planetary motion on the polishing pad while pressing the surface of the wafer against the polishing pad and supplying slurry containing abrasive.

As shown in FIG. 12, an example of such a polishing head comprises a head main body 53 composed of a top plate portion 51 and a cylindrical peripheral wall portion 52 fastened to the outer periphery of the top plate portion 51, a diaphragm 54 consisting of an elastic material such as rubber stretched inside the head main body 53, a pressure adjusting mechanism 56 for adjusting the pressure in a fluid chamber 58, a disc-like carrier 55 fastened to the lower surface of the diaphragm 54, and an annular retainer ring 57 concentrically arranged in the outer periphery of the carrier 55.

The carrier 55 and the retainer ring 57 are respectively fixed to a carrier fixing ring 59 and a retainer ring fixing ring 62 provided on the upper side of the diaphragm 54, and the retainer ring 57 is arranged concentrically, with a slight gap being provided between the outer peripheral surface of the carrier 55 and the peripheral wall portion 52. When polishing a wafer, a wafer 70 is attached, for example, by vacuum suction, to a wafer attachment sheet 71 provided on the lower side of the carrier 55, with its outer periphery being engaged with the retainer ring 57. Then, the surface of the wafer 70 is brought into contact with a polishing pad 63 attached to the upper surface of a platen 61, and polishing is conducted by rotating a wafer polishing head 50 while supplying slurry containing abrasive.

In many cases, the wafer 70 is automatically attached to the lower surface of the polishing head 50 by means of a wafer loading device having a disc-like wafer support portion. At this time, the wafer 70 is accommodated in a wafer cassette, and extracted from the wafer cassette by a wafer extracting mechanism before it is conveyed to the wafer loading device. Then, the wafer 70 is conveyed to a position below the polishing head 50 by the wafer loading device, and the wafer support portion is brought close to the polishing head 50, whereby the wafer 70 is attached to the polishing head 50.

When the process for polishing the wafer 70 has been completed and the polishing head 50 is raised so as to be separated from the polishing pad 63, a wafer unloading device 81 having a disc-like wafer support portion 80 is arranged below the polishing head 50, as shown in FIG. 13, in order to receive the wafer 70 which has undergone the polishing process. Then, the wafer 70, which has been released from the attraction by the polishing head 50, is supported on the wafer support portion 80. The wafer support portion 80 supporting the wafer 70 moves so as to approach a robot arm 82 for conveying the wafer 70 to the next step. A suction mechanism is formed at the forward end 82a of the robot arm 82, and the wafer 70 is held by being sucked by the suction mechanism at the forward end 82a, and conveyed to the next step.

When the wafer 70 is attracted by the robot arm 82, the robot arm 82 first pressurizes the upper surface of the wafer 70, and stabilizes the surface with which the wafer 70 is attracted by the robot arm 82. Then, the upper surface of the wafer 70 is attracted by the suction mechanism at the forward end 82a of the robot arm 82, whereby the wafer 70 is held and conveyed to the next step.

When attaching the wafer 70 to the polishing head 50 by using this wafer loading device, the wafer loading device must perform the positioning correctly at the time of attaching the wafer 70 before the wafer 70 can be engaged with the retainer ring 57 in a stable manner. In this process, a high level of machining accuracy is required of each portion of the wafer loading device and high accuracy is required of each drive section.

When transferring the wafer to the robot after detaching the wafer 70 from the polishing head 50, the robot arm 82 is brought into press contact with the wafer 70 so as to attract the wafer 70 in a stable manner. At this time, a moment acts on the robot arm 82. However, since the robot arm 82 is in the form of a thin plate, it is subject to bending, so that it is brought into contact with the wafer 70 in an unstable manner. Further, since the robot arm 82 repeats bending, the service life of the robot arm 82 is rather short.

Further, foreign matter such as polishing swarf generated at the time of polishing the wafer adheres to the wafer 70 and the lower side of the polishing head 50. Due to this foreign matter, there is naturally the danger of the wafer 70 and the polishing head 50 being damaged. Furthermore, when the foreign matter is dried, it sticks to the lower side of the polishing head 50, etc., so that much effort is needed to perform cleaning.

SUMMARY OF THE INVENTION

The present invention has been made with a view to above problem in the conventional technique. Accordingly, it is an object of the present invention to provide a wafer loading/unloading device which is capable of performing positioning and mounting easily and in a stable manner when attaching the wafer to the polishing head and which can receive the polished wafer in a stable manner and pass it to the next step and a method of producing wafers.

To achieve the above object, there is provided in accordance with the present Invention a wafer loading/unloading device for attaching a wafer to a polishing head and receiving the wafer from the polishing head, comprising a main body portion formed in a circular configuration in plan view and adapted to support a wafer, a swinging arm supporting the main body portion, a swinging shaft for supporting the swinging arm so as to be horizontally swingable, an arm ascending/descending mechanism for supporting the swinging arm so that it can ascend and descend with the main body portion, and a swinging drive source for driving the swinging shaft, wherein the main body portion is equipped with a disc-like wafer support portion and an action force absorbing mechanism for absorbing a vertical force acting on the wafer support portion.

In accordance with the present invention, the wafer support portion is equipped with an action force absorbing mechanism which is a mechanism for absorbing a vertical force acting on the wafer support portion, so that the impact when the wafer is attached to the polishing head is mitigated. Thus, the wafer and the polishing head are prevented from being damaged. Further, when transferring the wafer to the robot after detaching the wafer from the polishing head, if the robot arm presses the wafer downward, the wafer also moves downward due to the action force absorbing mechanism. As a result, the moment acting on the robot arm in the form of a thin plate is reduced, and the forward end portion of the robot arm can be brought into contact with the upper surface of the wafer, with the robot arm not being bent. Thus, the robot arm can reliably hold the wafer, so that the wafer can be passed to the next step in a stable manner.

Further, the wafer support port-on is of a floating construct which is equipped with a swinging mechanism for swingably supporting the wafer support portion. Thus, when attaching he wafer, if the carrier lower surface which is the wafer attachment surface of the polishing head is positionally somewhat deviated from the wafer, the wafer support portion which is of a floating construction swings, whereby the wafer can be attached to the lower surface of the carrier in a stable manner. Further, due to the floating effect of the wafer support portion, the wafer and the carrier lower surface are not abruptly brought into contact with each other. Thus, the wafer and the carrier lower surface are prevent from being damaged.

The loading/unloading device of the present invention is equipped with an engagement portion which restricts excessive movement in the horizontal and vertical directions of the wafer support portion, so that if great disturbance acts on the wafer support portion, and the wafer support portion swings greatly, an excessive movement of the wafer support portion is prevented by the engagement portion. Thus, no interference is generated between the wafer supported by the wafer support portion and each portion of the polishing head and the device. Thus, damage to the wafer is prevented.

The loading/unloading device of the present invention is equipped with an annular retainer ring engagement portion which is provided above the wafer support portion and which is capable of being engaged with the retainer ring of the polishing head, so that when attaching the wafer to the polishing head, the retainer ring engagement portion and the retainer ring lower surface are engaged with each other. At this time, the wafer support portion is of a floating structure using the retainer ring engagement portion as a reference. Thus, even if at the time of attaching the wafer the carrier lower surface which constitutes the wafer attachment surface of the polishing head is positionally somewhat deviated from the wafer, the positioning of the wafer supported by the swinging wafer support portion is accurately effected, with the wafer being guided by the retainer engagement ring and the inner peripheral wall of the retainer ring. Thus, the wafer is attached to the carrier lower surface in a stable manner.

The distance between the wafer support portion and the retainer ring engagement portion is set to be larger than the wafer upper surface and the polishing head attachment surface a the time of attaching or detaching the wafer to or from the polishing head, so that before the wafer is attached to the carrier which forms the wafer attachment surface of the polishing head, the retainer ring engagement portion is not brought into contact with the wafer support portion. Thus, the wafer support portion continues to be swung until the wafer is attached to the carrier. That is, the positioning of the wafer is effected in a stable manner due to the floating effect.

In the loading/unloading device of the present invention, a cleaning mechanism for cleaning at least one of the polishing head and the wafer is provided in the vicinity of the center of the main body portion, so that it is possible to remove foreign matter from the lower portion of the polishing head and the carrier lower surface before the wafer is attached to the polishing head or it is detached to the polishing head. Thus, it is possible to prevent defective adhesion between the wafer and the carrier due to foreign matter. Further, it is possible to prevent damage to the wafer due to foreign matter. The foreign matter adhering to the lower surface of the wafer which has undergone polishing is removed by cleaning by the cleaning mechanism. Thus, the wafer is supported by the wafer support portion in a stable manner.

Further, the main body portion equipped with the cleaning mechanism also swings to the lower side of the polishing head to which no wafer is attached. By cleaning the polishing head to which no wafer is attached by the cleaning mechanism, it is always possible to prevent adhesion of foreign matter.

In the loading/unloading device of the present invention, there is provided at the upper end of the wafer support portion a second cleaning mechanism for cleaning the upper surface of the wafer detached from the polishing head, so that both the upper and lower side of the polished wafer are cleaned. That is, since the wafer upper surface which is the surface to which the robot arm for conveyance to the next step is also cleaned, it is possible to prevent a deterioration in the attraction force of the robot arm due to foreign matter. Further, it is possible to prevent damage to the wafer due to foreign matter.

The wafer support portion is equipped with a wafer engagement portion for restricting the horizontal movement of the supported wafer, so that the wafer is supported by the wafer support portion in a stable manner.

In accordance with the present invention, there is provided a method for producing wafers of the type which includes a step for attaching the wafer to a polishing head to perform polishing, the method comprising the steps of arranging below the polishing head a main body portion equipped with a disc-like wafer support portion, an action force absorbing mechanism for absorbing a vertical force acting on the wafer support portion, and an annular retainer ring engagement portion provided above the wafer support portion and capable of being engaged with the retainer ring of the polishing head, cleaning the polishing head by spraying cleaning liquid from a cleaning mechanism provided in the vicinity of the center of the main body portion, moving the main body portion from below the polishing head to support an unpolished wafer on the wafer support portion, arranging it again at the position below the polishing head, bringing the main body portion close to the polishing head to bring the retainer ring engagement portion into contact with the retainer ring of the polishing head, bringing the wafer support portion close to the Polishing head while swinging it to thereby attach the wafer to the polishing head, and polishing the wafer by rotating the polishing head while pressing the wafer against a polishing pad.

In accordance with the present invention, the unpolished wafer supported by the wafer support portion which is of a floating structure is guided by the inner peripheral wall of the retainer ring engagement portion and the inner peripheral wall of the retainer ring and attached to the polishing head reliably and accurately. Further, since the wafer is attached to the polishing head after cleaning it by the cleaning mechanism, the wafer is prevented from being damaged and the attachment is effected in a stable manner.

Further, in accordance with the present invention, there is provided a method for producing wafers of the type which includes a step for detaching a wafer polished by a polishing head, the method comprising the steps of arranging below the polishing head with the polished wafer a main body portion equipped with a disc-like wafer support portion, and an action force absorbing mechanism for absorbing a vertical force acting on the wafer support portion, cleaning the wafer lower surface and the polishing head by spraying cleaning liquid from a cleaning mechanism provided in the vicinity of the center of the main body portion, detaching the wafer from the polishing head to support is on the wafer support portion, cleaning the wafer upper surface by spraying cleaning liquid from a second cleaning mechanism provided at the upper end of the wafer support portion, passing the wafer whose upper and lower surfaces have been cleaned to a robot arm of the next step while absorbing the vertical force by the action force absorbing mechanism, and arranging the main body portion below the polishing head again to clean the polishing head by the cleaning mechanism.

In accordance with the present invention, the wafer which has undergone the polishing process is passed to the next step after its upper and lower surfaces have been cleaned, so that damage to the wafer is prevented. Further, the polishing head to which no wafer is attached yet is cleaned with cleaning liquid sprayed from the cleaning mechanism and is prevented from being dried. Thus, foreign matter is prevented from sticking to the polishing head, and damage to the wafer at the time of attaching it to the polishing head is prevented.

DESCRIPTION OF THE PREFERRED EMBODIMENT

Figure 1:
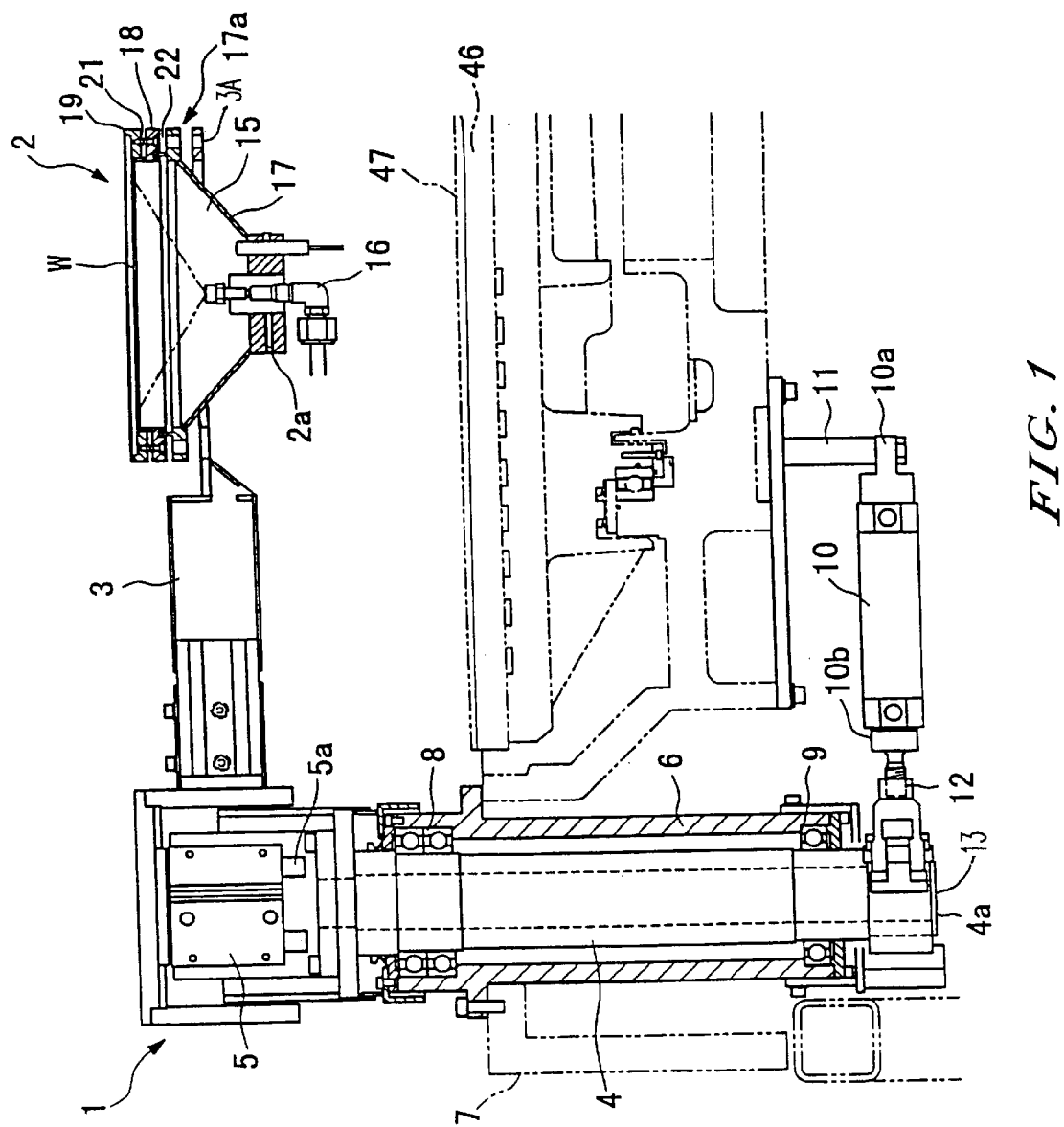
FIG. 1 is a side sectional view showing an embodiment of the loading device of the wafer loading/unloading device of the present invention.

A wafer loading/unloading device according to an embodiment of the present invention will now be described with reference to the drawings. FIG. 1 is a side sectional view showing an embodiment of the loading device of the wafer loading/unloading device of the present invention, and FIG. 2 is a plan view of FIG. 1 as seen from above.

Figure 2:
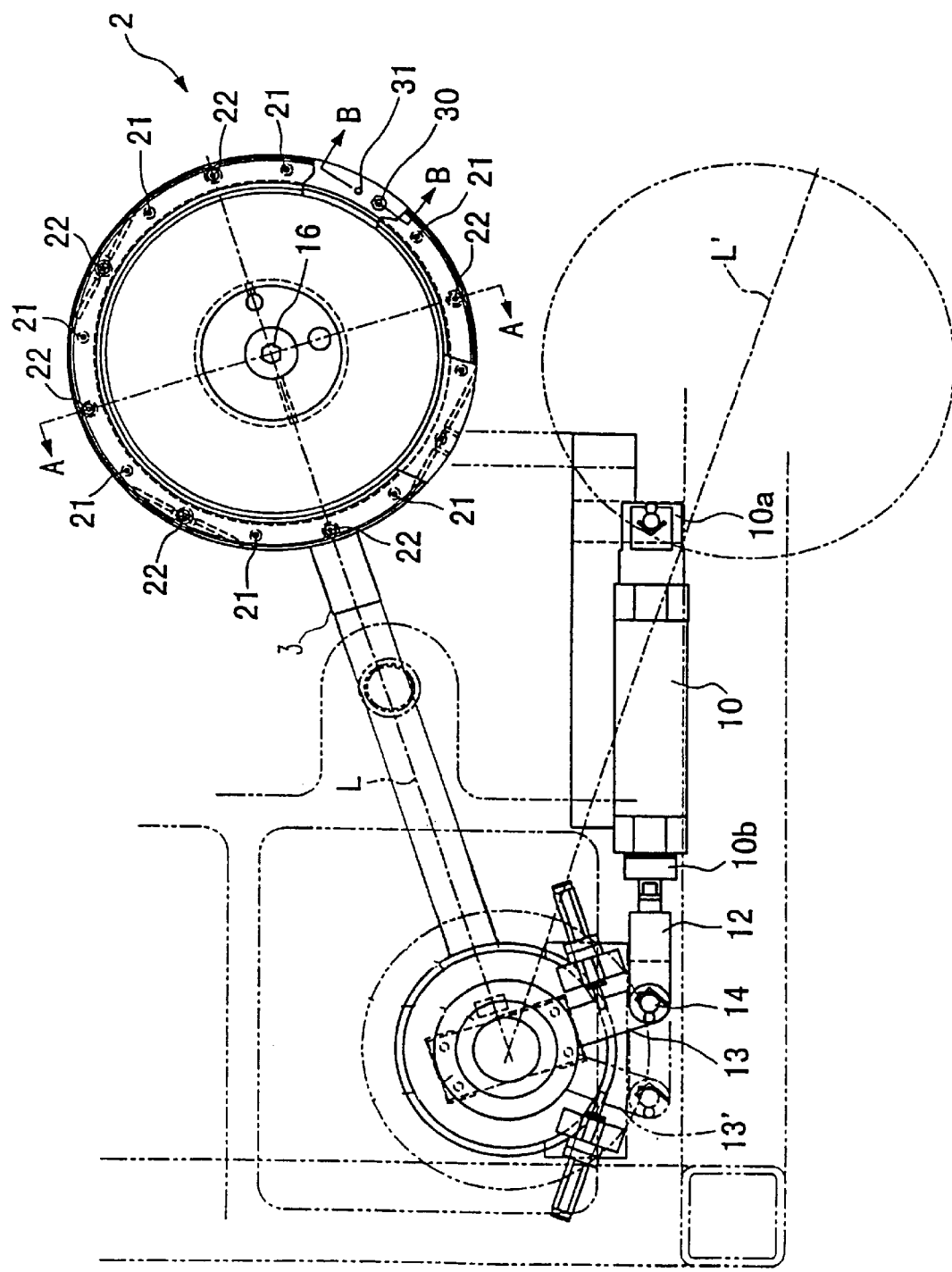
FIG. 2 is a plan view of FIG. 1 as seen from above.

In FIGS. 1 and 2, the loading device 1 comprises a loading portion (main body portion) 2 formed in a circular configuration in plan view, a swinging arm 3 supporting the loading portion 2, a swinging shaft 4 supporting the swinging arm 3 so as to be horizontally swingable, and an arm ascending/descending mechanism 5 supporting the swinging arm 3 so that it can ascend and descend. Further, below the loading portion 2, there is arranged a polishing pad 47 attached to a platen 46.

Around the swinging shaft 4, which is vertically arranged, there is provided an outer cylindrical portion 6 which is fixed to a device frame 7 by bolts, and the upper and lower end portions of the swinging shaft 4 protrude from the outer cylindrical portion 6. Further, two bearings 8 and 9 are provided inside the outer cylindrical portion 6, and the swinging shaft 4 is rotatably supported by the bearings 8 and 9.

Below the swinging shaft 4, a drive source 10 adapted to rotate the swinging shaft 4 is horizontally arranged. A base portion 10a of this drive source 10 is secured to a stationary portion 11, and a first connecting shaft 12 is joined with an operating end portion 10b. Further, secured to the lower end portion 4a of the swinging shaft 4 protruding from the lower end of the outer cylindrical portion 6 is a second connecting shaft 13 which extends horizontally, and the second connecting shaft 13 and the first connecting shaft 12 are joined together by a hinge portion 14. As shown in FIG. 2 by operating the drive source 10, the second connecting shaft 13 is moved to the position indicated at 13', whereby the swinging shaft 4 is rotated.

Joined to the upper end portion of the swinging shaft 4 is the swinging arm 3 formed so as to extend horizontally. Through the rotation of the swinging shaft 4, the swinging arm 3 swings in the range between position L and position L' in FIG. 2.

The swinging arm 3 ascends and descends by the arm ascending/descending mechanism 5 provided above the swinging shaft 4. The arm ascending/descending mechanism 5 is equipped with a guide shaft 5a, and it ascends and descends along this guide shaft 5a.

Provided at the forward end of the swinging arm 3 is the loading portion (main body portion) 2, which is the portion that attaches the wafer W to the polishing head. This loading portion 2 has a circular configuration in plan view, and includes a hollow portion 15 having a conical section. The loading portion 2 comprises a base portion 17 formed conically so as to surround the hollow portion 15, an annular wafer support portion 18 for supporting the wafer W which is formed concentrically above the opening edge portion 17a of the base portion 17, and an annular retainer ring engagement portion 19 provided above the wafer support portion 18.

Further, at the bottom 2a of the loading portion 2, there is provided a cleaning mechanism 16 for cleaning the polishing head. This cleaning mechanism 16 ejects vertically upward cleaning water for cleaning the lower surface of the polishing head before the wafer attached. So it is possible to remove foreign matter from the lower surface before the wafer is attached to the polishing head. Thus, it is possible to prevent defective adhesion between the wafer and the carrier due to foreign matter.

Figure 3:
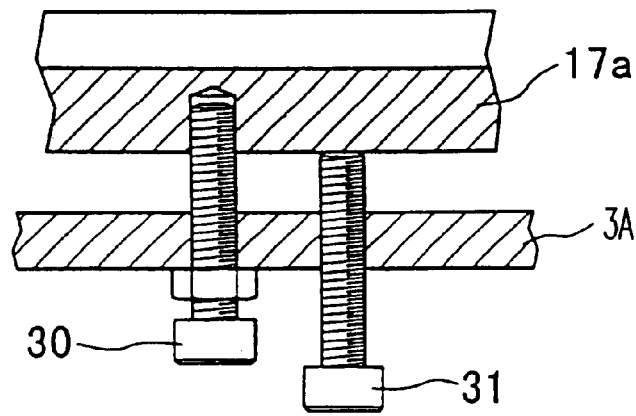
FIG. 3 is a diagram illustrating the portion near the opening edge portion shown in FIG. 2 taken along the line A—A.

As shown in FIG. 3, on the upper surface of the opening edge portion 17a of the base portion 17, there is formed an annular protrusion 17b, which is engaged with play with an annular recessed section 18a provided on the lower surface of the wafer support portion 18. So, the wafer support portion 18 is prevented from greatly swinging even if unexpected great disturbance is generated, and the wafer W supported by the wafer support portion 18 is prevented from being damaged by coming into contact with the polishing head, etc. Further, the base portion 17 and the wafer support portion 18 are joined together by a second biasing mechanism (action force absorbing mechanism) 22 consisting of springs, and, as shown in FIG. 2, joined at a plurality of positions. By the second biasing means 22, the wafer support portion 18 is supported so as to be horizontally movable and vertically biased.

In the inner periphery of the wafer support portion 18, there is formed a wafer placing portion 18b which is in conformity with the configuration of the wafer W, and its forward end portion extends to the inner peripheral wall surface (wafer engagement portion) 19b of the annular retainer ring engagement portion 19 provided concentrically above the wafer support portion 18. The forward end surface 18c is formed as a flat surface, which comes into contact with the wafer W.

Figure 4:
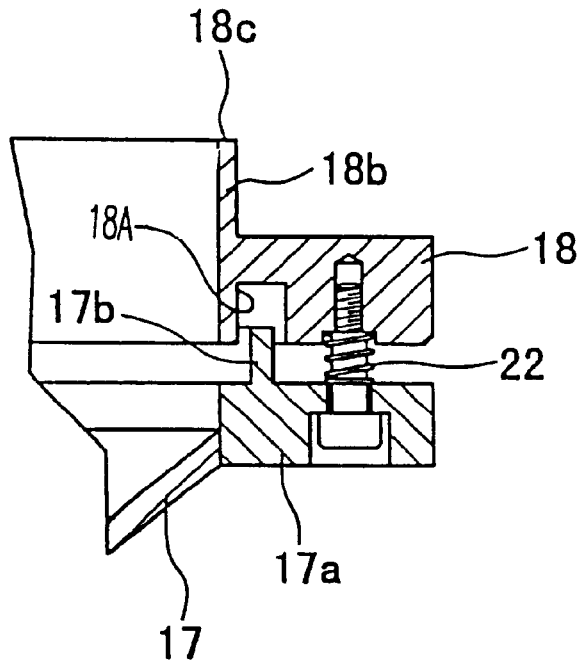
FIG. 4 is a sectional view taken along the line B—B of FIG. 2.

As shown in FIG. 4, a first bolt 30 and a second bolt 31 are provided so as to join the opening edge portion 17a of the base portion 17 with the end portion 3a of the arm 3. By adjusting the first bolt 30 and the second bolt 31, it is possible to adjust the inclination of the loading portion 2.

Figure 5:
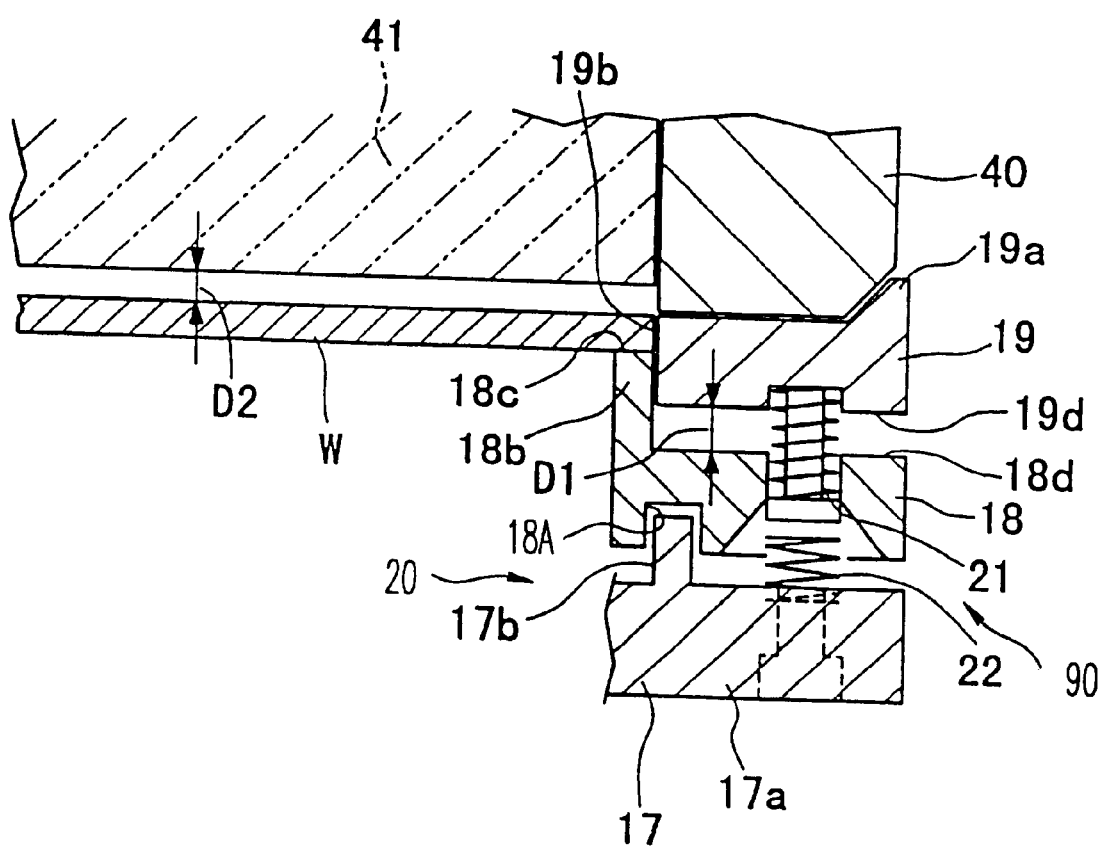
FIG. 5 is an enlarged sectional view of the portion near the action force absorbing mechanism.

As shown in FIG. 5, on the upper surface of the annular retainer ring engagement portion 19 provided above the wafer support portion 18, there is formed an annular tapered retainer ring positioning portion 19a protruding in the outer periphery so as to be in conformity with the configuration of the lower surface of the retainer ring 40. When attaching the wafer W to the lower surface of the carrier 41, which is the wafer attachment surface of the polishing head, the upper surface of the retainer ring engagement portion 19 is brought into contact with the lower surface of the retainer ring, and the retainer ring positioning portion 19a is engaged with the retainer ring 40, whereby the retainer ring engagement portion 19 is secured in position.

The retainer ring engagement portion 19 and the wafer support portion 18 are joined to each other by the first biasing mechanism 21 consisting of a plurality of annularly provided springs, and the wafer support portion 18 is supported so as to be horizontally movable and vertically biased with respect to the retainer ring engagement portion 19. When attaching the wafer W to the lower surface of the carrier 41, the retainer ring engagement portion 19 is secured in position by engaging the positioning portion 19a with the lower surface of the retainer ring 40, so that the wafer support 18 makes a floating movement between the retainer ring engagement portion 19 and the base portion 17. That is, a floating mechanism 90 for floating the wafer support portion 18 is formed by the first biasing mechanism 21 and the second biasing mechanism 22.

When the retainer ring engagement portion 19 is brought into contact with the lower surface of the retainer ring 40, the distance D1 between the opposing surface 18d of the wafer support portion 18 which is the surface opposed to the lower surface 19d of the retainer ring engagement portion 19 is set to be larger than the distance D2 between the upper surface of the wafer W and the lower surface of the carrier 41 of the polishing head.

Figure 6:
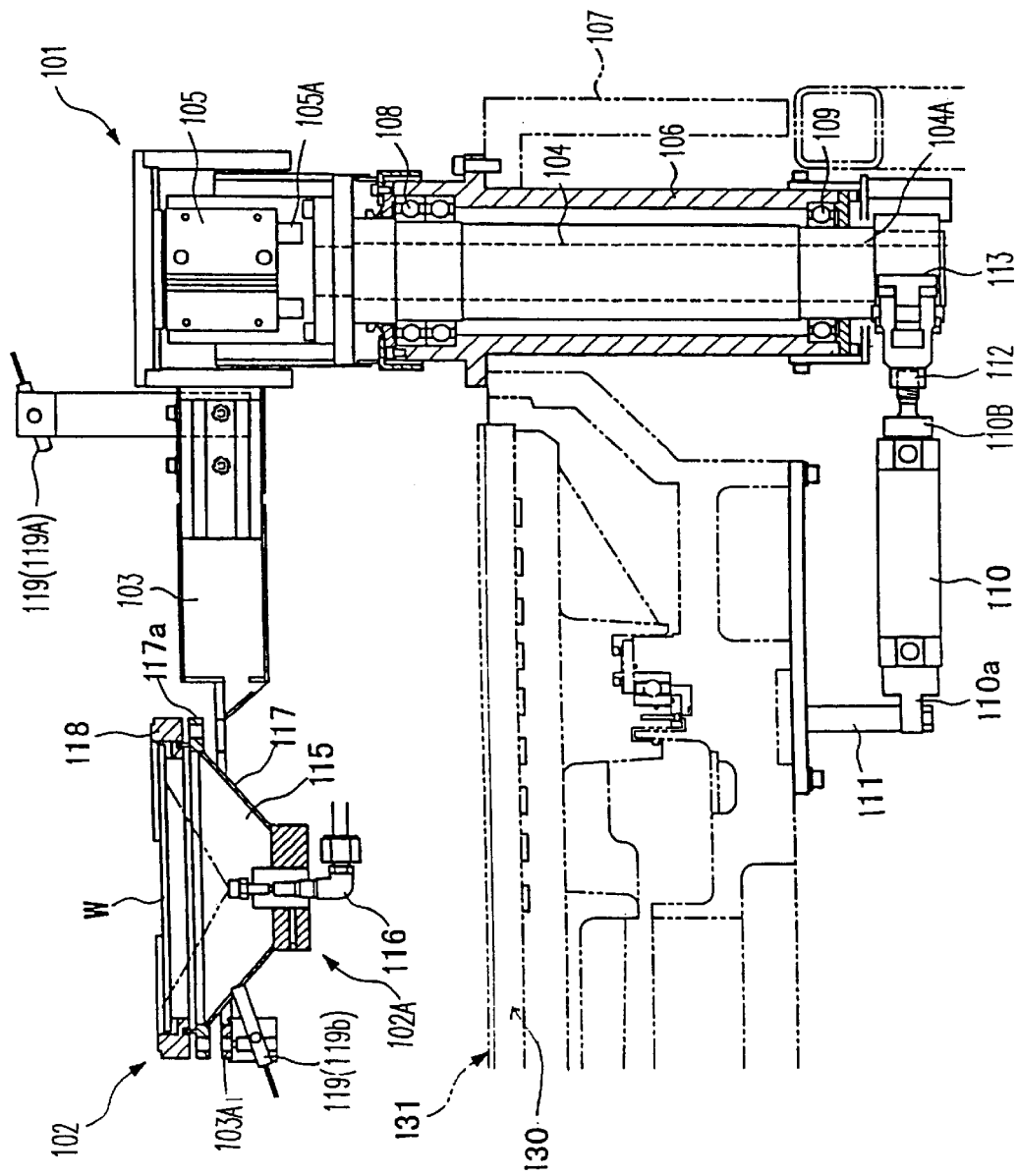
FIG. 6 is a side sectional view showing an embodiment of the unloading device of the wafer loading/unloading device of the present invention.
Figure 7:
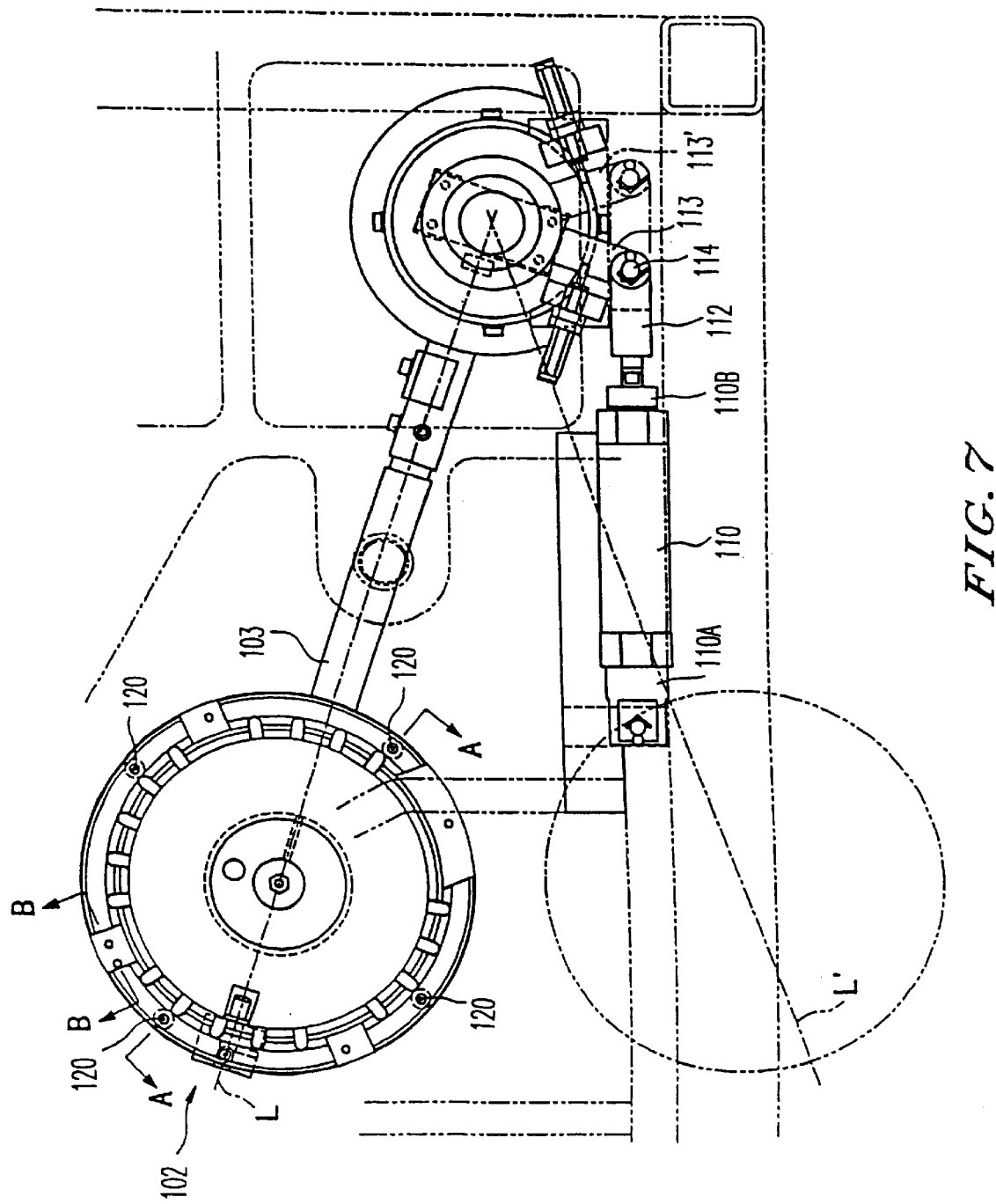
FIG. 7 is a plan view of FIG. 6 as seen from above.
Figure 8:
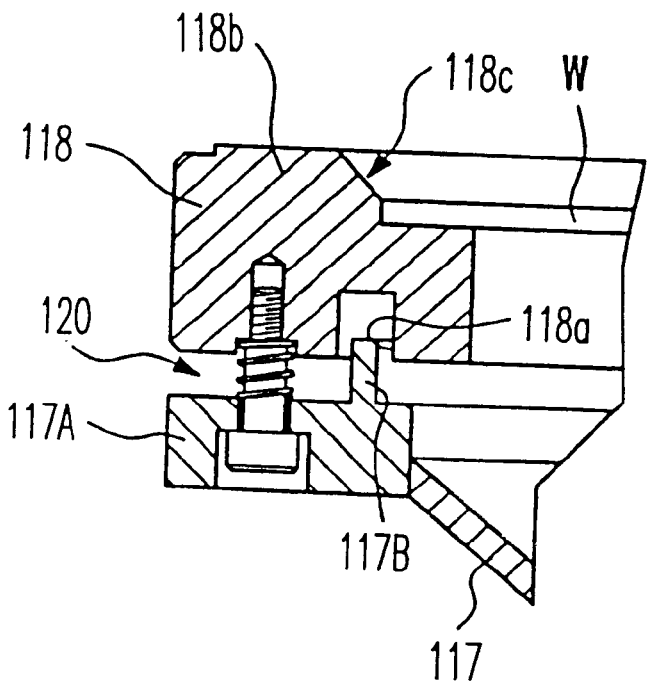
FIG. 8 is a diagram illustrating the portion near the opening edge portion shown in the sectional view of FIG. 7 taken along the line A—A.
Figure 9:
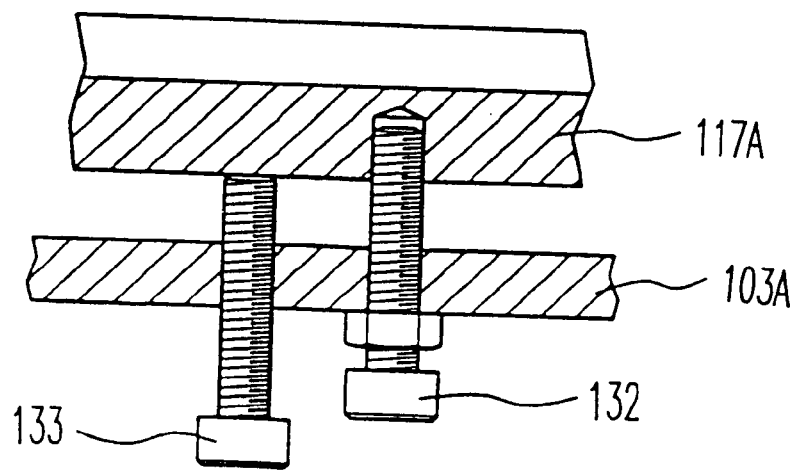
FIG. 9 is a sectional view taken along the line B—B of FIG. 7.

Next, of the wafer loading/unloading device according to an embodiment of the present invention, the unloading device 101 is will be described with reference to the drawings. FIG. 6 is a side sectional view showing a wafer unloading device according to an embodiment of the present invention, and FIG. 7 is a plan view of FIG. 6 as seen from above. Further, FIG. 8 show a part of a sectional view taken along the line A—A of FIG. 7, and FIG. 9 is a sectional view taken along the line B—B of FIG. 7.

In FIGS. 6 and 7, the unloading device 101 comprises an unloading portion (main body portion) 102 formed in a circular configuration in plan view, a swinging arm 103 supporting the unloading portion 102, a swinging shaft 104 for supporting the swinging arm 103 so as to be capable of swinging horizontally, and an arm ascending/descending mechanism 105 supporting the swinging arm 103 so that it can ascend and descend. Further, below the unloading portion 102, there is arranged a polishing pad 131 attached to a platen 130.

Around the vertically provided swinging shaft 104, there is provided an outer cylindrical portion 106 secured to a device frame 107 by bolts, and the upper and lower end portions of the swinging shaft 104 protrude beyond the outer cylindrical portion 106. Further, inside the outer cylindrical portion 106, there are installed two bearings 108 and 109, and the swinging shaft 104 is rotatably supported by these bearings 108 and 109.

Below the swinging shaft 104, a drive source 110 for rotating the swinging shaft 104 is horizontally arranged. The base end portion 110a of this drive source 110 is secured to a stationary portion 111, and the operating end portion 110b is connected to a first connecting shaft 112. Further, to the lower end portion 104a of the swinging shaft 104 protruding from the lower end of the outer cylindrical portion 106, a second connecting shaft 113 is secured so as to extend horizontally, and the first connecting shaft 112 and the second connecting shaft 113 are joined together by a hinge portion 114. And, as shown in FIG. 7, by driving the drive source 110, the second connecting shaft 113 is moved to the position indicated at 113', whereby the swinging shaft 104 rotates.

Figure 10:
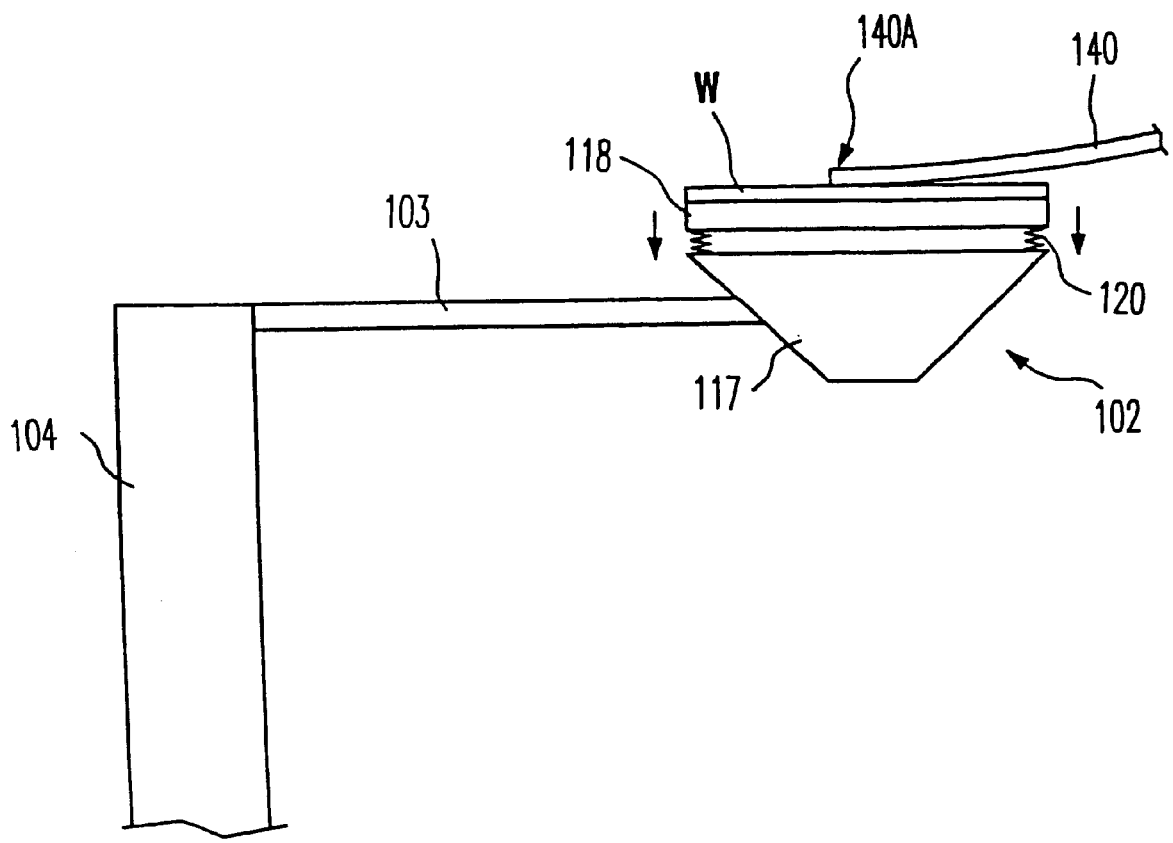
FIG. 10 is a diagram illustrating how a wafer is attracted by a robot arm.

Further, to the upper end portion of the swinging shaft 104, there is connected a swinging arm 103 formed so as to extend horizontally, and by the rotation of the swinging shaft 104, the swinging arm 103 swings within the range between L and L' of FIG. 7. The position L represents the position in which the unloading portion 102 is swung to a position below the polishing head, and the position L' represents the position in which the wafer W that has undergone the polishing process is passed to the next step. The wafer W swung to the position L' is received by the robot arm 140 as shown in FIG. 10 and passed to the next step.

The swinging arm 103 ascends and descends by the arm ascending/descending mechanism 105 provided above the swinging shaft 104. This arm ascending/descending mechanism 105 is equipped with a guide portion 105a, and ascends and descends along this guide portion 105a.

At the forward end of the swinging arm 103, there is provided an unloading portion (main body portion) 102 which is a portion for receiving from the polishing head the wafer W which has undergone the polishing process. This unloading portion 102 has a circular configuration in plan view, and includes a hollow portion 115 having a conical section. And, the unloading portion 102 comprises a base portion 117 formed in a conical configuration so as to surround the hollow portion 115, an annular concentric wafer support portion 118 which is formed above the opening edge portion 117a of the base portion 117 and on which the wafer W is to be placed, and a cleaning mechanism 116 provided at the bottom 102a of the unloading portion 102.

From this cleaning mechanism 116, cleaning water for cleaning the lower surface of the wafer W which has undergone the polishing process is ejected vertically upward so as to hit the lower surface of the wafer W. Further, this cleaning water is also ejected toward the polishing head when no wafer W is attached thereto. This is for the purpose of preventing the lower surface of the polishing head from drying. The cleaning mechanism 116 ejects cleaning water any time against the lower surface of the polishing head to thereby prevent foreign matter such as swarf generated as a result of polishing from sticking to it. For this purpose, the unloading portion 102 swings to the position L' to pass the wafer W that has undergone polishing to the next step and then swings to the position L to eject cleaning water toward the polishing head or to be ready for the unloading of the next wafer W.

As shown in FIGS. 8, on the upper surface of the opening edge portion 117a of the base portion 117, there is formed an annular protrusion 117b. Further, on the lower surface of the wafer support portion 118, an annular recess 118a is formed, and the protrusion 117b and the recess 118a are engaged with each other with play. So, the wafer support portion 118 is prevented from greatly swinging even unexpected great disturbance is generated, and the wafer W supported by the wafer support portion 118 is prevented from being damaged by coming into contact with the polishing head, etc.

Further, the base portion 117 and the wafer support portion 118 are connected to each other by an action force absorbing mechanism 120 consisting of springs, and, as shown in FIG. 7, this action force absorbing mechanism 120 is provided at a plurality of positions. And, by the operation of the action force absorbing mechanism 120, the wafer support portion 118 is supported so as to be horizontally movable and vertically biased with respect to the base portion 117.

As shown in FIG. 9, the opening edge portion 117a of the base portion 117 and the swinging arm forward end portion 103a are joined together by a first bolt 132 and a second bolt 133. And, by adjusting the first bolt 132 and the second bolt 133, the inclination of the unloading portion 102 is adjusted.

In the upper outer periphery of the wafer support portion 118, a protrusion-like annular abutting portion 118b is formed, and its upper surface is formed as a flat surface. Further, on the inner side of the abutting portion 118, there is formed a wafer engagement portion 118c having a tapered configuration, and the wafer W which has undergone polishing is engaged with the inner side of the wafer engagement portion 118c. And, when detaching the wafer W from the polishing head, the abutting portion 118b of the wafer support portion 118 abuts the lower surface of the retainer ring of the polishing head. The wafer, which has been released from the attraction by the polishing head, falls on the wafer support portion 118 while being guided by the wafer engagement portion 118c of the wafer support portion, and is engaged with the inner side of the wafer engagement portion 118c.

A sensor 119 is provided in the vicinity of the wafer support portion 118. This sensor 119 is equipped with a light projector 119a and a light receptor 119b, and the light projected from the light projector 119a passes the portion where the wafer W is placed. By means of this sensor 119, it is recognized whether the wafer W is placed on the wafer support portion 118 or not.

Next, the operation of attaching or detaching the wafer W to or from the polishing head by this wafer loading/unloading device will be described.

First, when attaching the wafer W to the polishing head, the drive source 10 which is the swinging drive source of the loading portion 2 is driven to swing the loading portion 2, with no wafer W being placed on the loading portion 2, and the loading portion 2 is arranged below the polishing head.

Then, cleaning water is ejected from the head cleaning mechanism 16 to clean the polishing head, cleaning the lower portion of the polishing head and the lower surface of the carrier 41. As a result of the cleaning, foreign matter is removed from the lower portion of the polishing head and the lower surface of the carrier 41, so that it is possible to prevent defective adhesion of the wafer W to the lower surface of the carrier 41 due to foreign matter, and further, damage to the wafer W due to foreign matter can be prevented.

After the lower portion of the polishing head and the lower surface of the carrier 41 have been cleaned, the loading portion 2 swings so as to be moved away from the lower side of the polishing head by driving the drive source 10. By swinging, the loading portion 2 approaches a wafer conveying mechanism (not shown), and receives the conveyed wafer W, supporting the wafer W on the wafer support portion 18 of the loading portion 2. The loading portion 2, which has received the wafer W, swings back to the lower side of the polishing head.

The loading portion 2 supporting the wafer W operates with the swinging arm 3 by driving the arm ascending/descending mechanism 5 and approaches the polishing head. Then, through engagement of the lower surface of the retainer ring 40 and the positioning portion 19a of the retainer ring engagement portion 19, the retainer ring engagement portion 19 is secured in position.

The loading portion 2 further approaches the polishing head by driving the arm ascending/descending mechanism 5. At this time, the wafer support portion 18 is of a floating structure with respect to the base portion 17 and the retainer ring engagement portion 19. That is, the wafer support portion 18 and the retainer ring engagement portion 19, and the wafer support portion 18 and the base portion 17 are respectively supported by the first biasing mechanism 21 and the second biasing mechanism 22 so as to be horizontally movable and vertically biased. The retainer ring engagement portion 19 is secured in position by engaging the positioning portion 19a thereof with the lower surface of the retainer ring 40. On the other hand, the base portion 17 is supported by the swinging arm 3, so that the wafer support portion 18 is in a floating state, and floats while supporting the wafer W. Thus, the wafer placing portion 18b of the wafer support portion 18 is slidably fitted into the inner peripheral wall surface 19b of the retainer ring engagement portion 19. Thus, if the carrier 41 is positionally somewhat deviated from the wafer W, as the loading portion 2 is raised, the wafer W placed on the wafer placing portion 18b is guided by the inner peripheral wall surface 19b of the retainer ring engagement portion 19 and the inner peripheral wall surface of the retainer ring 40 while floating and is accurately positioned.

Further, when the loading portion 2 approaches the polishing head, the recessed portion 18a and the protrusion 17b are brought into contact with each other due to the pushing up from below. That is, the wafer support portion 18 and the base portion 17 are brought into contact with each other. The wafer support portion 18 undergoes positioning in the horizontal direction and while doing so, the wafer placing portion 18b on which the wafer W is placed slides upward along the inner peripheral wall 19b of the retainer ring engagement portion. Then, the wafer W is attached to the lower surface of the carrier 41.

At this time, the distance D1 between the lower surface 19d of the retainer ring engagement portion 19 and the opposing surface 18d of the wafer support portion 18 is set to be larger than the distance D2 between the upper surface of the wafer W and the lower surface of the carrier 41. Thus, before the wafer W is attached to the carrier 41, the lower surface 19d of the retainer ring engagement portion 19 does not come into contact with the opposing surface 18d of the wafer support portion 18. That is, the wafer support portion 18 floats until the wafer W is attached to the carrier 41, so that the wafer W is reliably attached to the polishing head.

And, since the wafer support portion 18 floats while being vertically biased by the first and second biasing mechanisms 21 and 22 consisting of springs, the wafer W and the lower surface of the carrier 41 do not abruptly come into contact with each other when attaching the wafer W. Thus, It is possible to prevent the wafer W and the lower surface of the carrier 41 from being damaged.

Further, since the wafer support portion 18 is equipped with an engagement portion 20 for restricting an excessive movement in horizontal and vertical directions, so that even if great disturbance acts on the wafer support portion 18 and the wafer support portion 18 floats to a great degree, the wafer support portion 18 is prevented from making excessive movement by the engagement portion 20. Thus, the wafer W supported by the wafer support portion 18 does not interfere with any part of the polishing head and the loading portion 2, so that damage to the wafer W can be prevented.

In this way, the wafer support portion 18 supporting the wafer W is joined to the retainer ring engagement portion 19 and the base portion 17 by the first biasing mechanism 21 and the second biasing mechanism 22, and the wafer support portion 18 is floatably supported while being biased by the first biasing mechanism 21 and the second biasing mechanism 22 so as to be horizontally movable and vertically biased. Thus, when attaching the wafer W, even if the lower surface of the carrier 41, which is the wafer attaching surface of the polishing head, and the wafer W are positionally somewhat deviated, the wafer support portion 18 of a floating structure floats as the wafer support portion 18 approaches the lower surface of the carrier 41, and the wafer W is accurately positioned while being guided by the inner peripheral wall surface 19b of the retainer ring engagement portion 19 and the inner peripheral wall surface of the retainer ring 40. Thus, the wafer W is attached to the lower surface of the carrier 41 reliably and in a stable manner. Further, due to the vertical floating effect of the wafer support portion 18, the wafer W and the lower surface of the carrier 41 are not abruptly brought into contact with each other, so that it is possible to prevent the wafer W and the lower surface of the carrier 41 from being damaged.

On the other hand, when receiving the wafer W from the polishing head by the wafer unloading device 101, the drive source 110, which is the swinging drive source of the unloading portion 102, is first driven so that the unloading portion 102 is arranged below the wafer W, and the unloading portion 102 is swung to the position L. Then, cleaning water is ejected from the cleaning mechanism 116 to clean the polished surface of the wafer W and the lower portion of the polishing head. Through the cleaning, any foreign matter is removed from the lower surface of the wafer W and the lower portion of the polishing head, so that the wafer W is placed on the wafer support portion 118 in a stable manner, and it is possible to prevent the wafer W from being damaged by foreign matter, After the lower surface of the wafer W and the lower portion of the polishing head have been cleaned, the polishing head cancels the attraction of the wafer W through suction by vacuum suction while bringing the abutting portion 118b of the wafer support portion 118 into contact with the lower surface of the retainer ring. Since the attraction by the polishing head is released, the wafer W falls on the wafer support portion 118 of the unloading portion 102 which has been placed in a standby condition below the wafer W. At this time, since the upper surface of the wafer support portion 118 is formed in a tapered configuration by the wafer engagement portion 118c, the wafer W is engaged with the wafer engagement portion 118c of the wafer support portion 118 when it falls.

Figure 11:
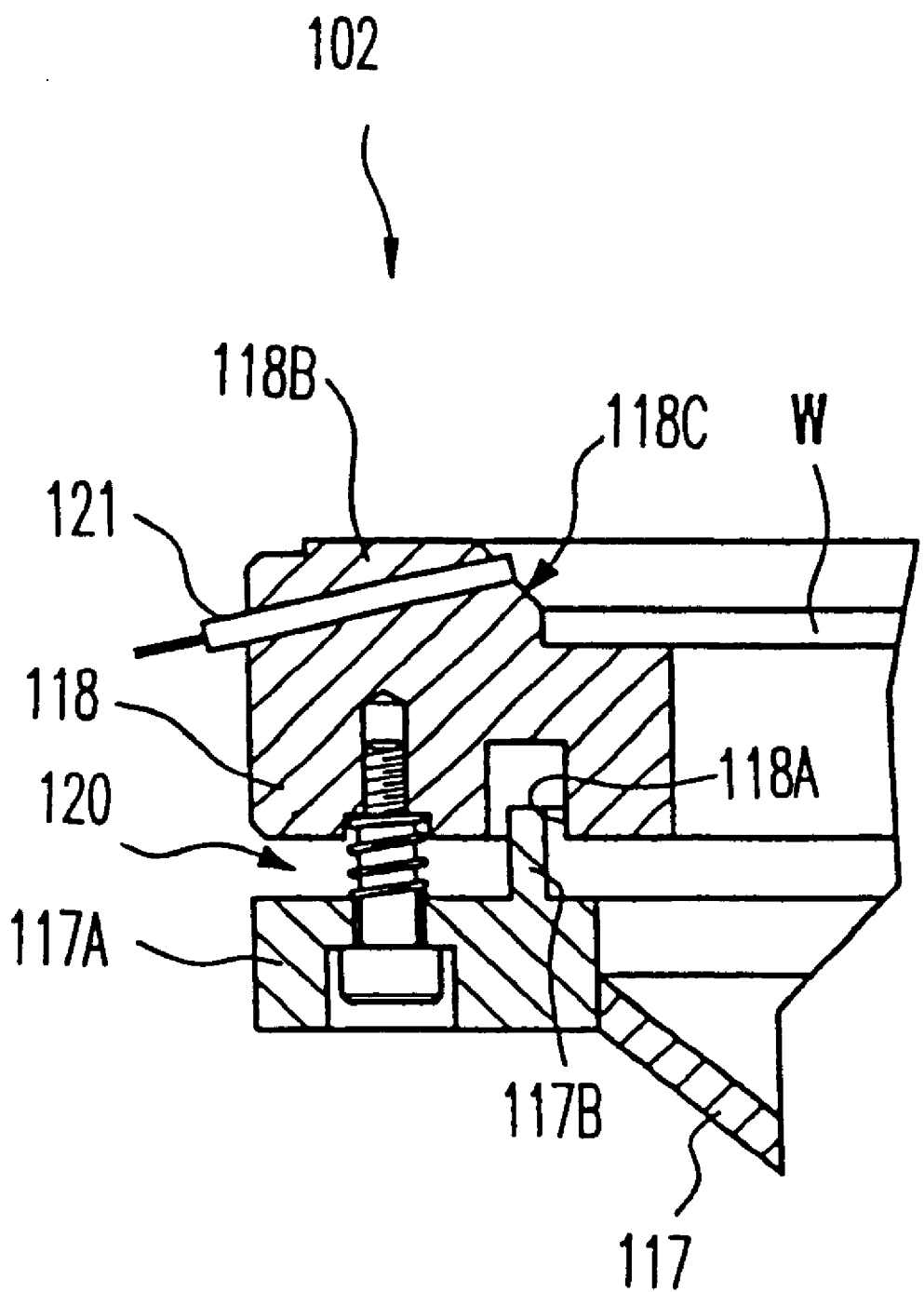
FIG. 11 is a diagram illustrating a second cleaning mechanism.
Figure 12:
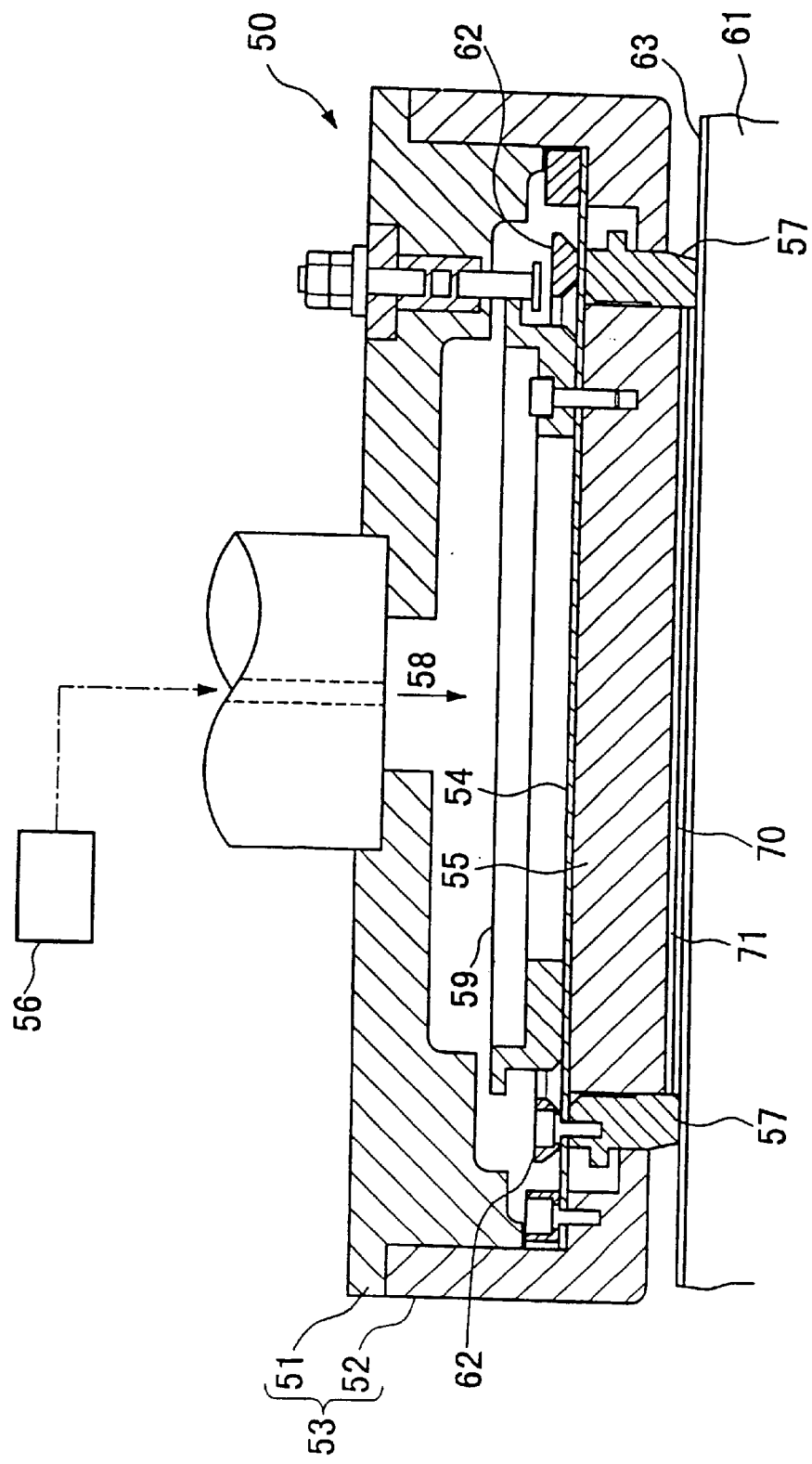
FIG. 12 is a diagram illustrating how a wafer is held by a polishing head.
Figure 13:
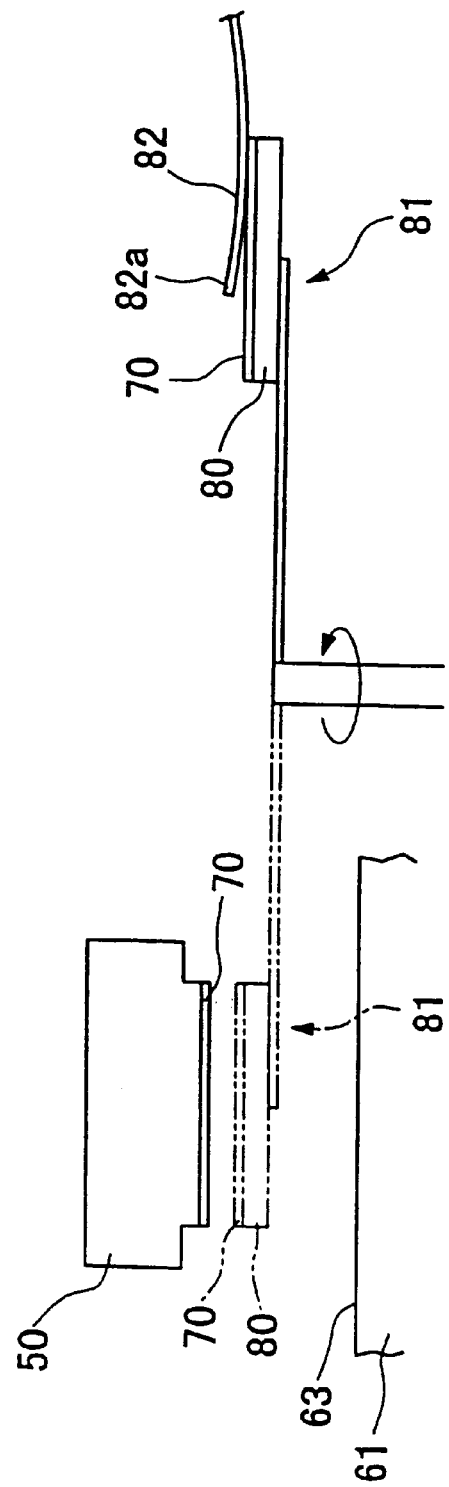
FIG. 13 is a diagram illustrating how the robot arm is bent.

The unloading portion 102 on which the polished wafer W is placed is swung to the position L' so as to be moved away from the polishing head by driving the drive source 110. At this time, the wafer W which has undergone the polishing process is received by the robot arm 140 as shown in FIG. 11 and passed to the next process.

As shown in FIG. 10, this robot arm 140 is supported so as to be capable of ascending and descending and moving horizontally by a drive device (not shown), and is formed as a thin plate having a thickness of, for example, approximately 2 mm. Further, an attraction mechanism is provided at the forward end 140a of the robot arm 140. The upper surface of the wafer W is attracted by this attraction mechanism, and the wafer W is retained by the robot arm 140. Then, to receive the wafer W which has undergone the polishing process, the robot arm 140 approaches from the side of the unloading portion 102 and passes a cutout portion of the unloading portion 102, and the forward end portion 140a equipped with the attraction mechanism is positioned above the wafer W placed on the unloading portion 102.

Then, the robot arm 140 positioned above the wafer W approaches the upper surface of the wafer W, and the forward end portion 140a of the robot arm 140 abuts the upper surface of the wafer W. At this time, to attract the upper surface of the wafer W in a stable manner, the robot arm 140 abuts the wafer so as to press the wafer W. In this case, the robot arm 140 is formed as a thin plate, so that by pushing in the wafer W, a moment acts on the robot arm 140, and the robot arm 140 is bent. Thus, the robot arm 140 and the upper surface of the wafer W are brought into contact with each other in a rather unstable manner. As a result, the attraction force between the robot arm 140 and the upper surface of the wafer W is reduced. Further, each time the wafer W is attracted, the robot arm 140 repeats bending, resulting in the service life of the robot arm 140 being reduced.

However, below the wafer support portion 118 of the unloading portion 102, there is provided at a plurality of positions an action force absorbing mechanism 120 consisting of springs, which is a mechanism for absorbing the vertical action force, so that if the robot arm 140 pushes the wafer W downward, the wafer W is also moved downward due to the action force absorbing mechanism 120. Thus, the moment acting on the robot arm 140, formed as a thin plate, is reduced, and the forward end portion 140a and the upper surface of the wafer W are brought into contact with each other, with the robot arm 140 not being bent. In this way, the robot arm 140 can reliably hold the wafer W, the wafer held by the robot arm 140 is reliably passed to the next process.

And, on the wafer support portion 118, there is provided a wafer engagement portion 118c for restricting horizontal movement of the wafer W placed, so that the wafer W is placed on the support portion 118 in a stable manner.

Further, at the center in plan view of the wafer support portion 118, there is provided a cleaning mechanism 116 for cleaning the wafer W which has undergone polishing, whereby the lower surface of the wafer W which has undergone polishing is cleaned by the cleaning mechanism 116, and foreign matter such as swarf is removed. Thus, the wafer W is placed on the wafer support portion 118 in a stable manner, and it is protected from being damaged by foreign matter. Further, the unloading portion 102 equipped with the cleaning mechanism 116 is swung to the position below the polishing head. And, even in the state in which no wafer W is attached to the polishing head, the unloading portion 102 which has passed the wafer W to the robot arm 140 is swung to the position L. And, by ejecting cleaning water to the lower portion of the polishing head to which no wafer W is attached, the lower portion of the polishing head is prevented from being dried. That is, when foreign matter such as swarf generated at the time of polishing the wafer and adhering to the polishing head is dried, it sticks to the lower portion of the polishing head, and it requires effort to remove it afterwards by cleaning. However, since the polishing head can be cleaned by the cleaning mechanism 116, the polishing head is prevented from being dried, and the maintenance can be facilitated.

As shown in FIG. 11, the unloading portion 102 may have a second cleaning mechanism 121 in the upper portion of the wafer support portion 118. By providing the second cleaning mechanism 121 in the upper portion of the wafer support portion 118, both the upper and lower surfaces of the polished wafer W are cleaned. That is, since the upper surface of the wafer W, which is the surface to which the robot arm 140 for passing the wafer to the next step is attracted, is also cleaned, it is possible to prevent a deterioration in the attracting force of the robot arm 140 due foreign matter.

The wafer loading/unloading device and the wafer producing method of the present invention provide the following advantages.

In the aspect of the invention as claimed in claim 1, the wafer support portion is equipped with an action force absorbing mechanism which is a mechanism for absorbing the vertical force acting on the wafer support portion, so that the impact when the wafer is attached to the polishing head is mitigated. Thus, damage to the wafer and the polishing head can be prevented. Further, when transferring the wafer to the robot after detaching the wafer from the polishing head, if the robot arm presses the wafer downward, the wafer also moves downward due to the action force absorbing mechanism. As a result, the moment acting on the robot arm formed as a thin plate is reduced, and the forward end of the robot arm and the upper surface of the wafer can be brought into contact with each other in a stable manner, with the robot arm not being bent. Thus, the robot arm can hold the wafer reliably, so that the wafer is passed to the next step in a stable manner.

In the aspect of the invention as claimed in claim 2, the wafer support portion is of a floating structure equipped with a floating mechanism for floatably supporting the wafer support portion. Thus, when attaching the wafer, if the carrier lower surface, which is the wafer attachment surface of the polishing head, is positionally somewhat deviated from the wafer, the wafer support portion, which is of a floating structure, floats, whereby the wafer can be attached to the lower surface of the carrier in a stable manner. Further, due to the floating effect of the wafer support portion, the wafer and the carrier lower surface are not brought into contact with each other abruptly. Thus, damage to the wafer and the carrier lower surface can be prevented.

In the aspect of the invention as claimed in claims 3 and 4, there is provided an engagement portion which restricts excessive movement of the wafer support portion in the horizontal and vertical directions, so that if great disturbance acts on the wafer support portion and the wafer support portion floats greatly, excessive movement of the wafer support portion is prevented by the engagement portion. Thus, no interference is generated between the wafer supported by the wafer support portion and the polishing head and each device portion. Thus, damage to the wafer can be prevented.

In the aspect of the invention as claimed in claims 5 to 7, there is provided an annular retainer ring engagement portion which is provided above the wafer support portion and which can engage with the retainer ring of the polishing head, so that when attaching the wafer to the polishing head, the retainer ring engagement portion is engaged with the lower surface of the retainer ring. At this time, the wafer support portion is of a floating structure with respect to the retainer ring engagement portion. Thus, when attaching the wafer, if the carrier lower surface, which is the wafer attachment surface of the polishing head, is positionally somewhat deviated from the wafer, the positioning of the wafer supported by the floating wafer support portion is accurately effected, with the wafer being guided by the retainer ring engagement portion and the inner peripheral wall surface of the retainer ring. Thus, the wafer is attached to the carrier lower surface in a stable manner.

In the aspect of the invention as claimed in claims 8 to 10, the distance between the wafer support portion and the retainer ring engagement portion is set to be larger than the distance between the wafer upper surface and the polishing head attachment surface at the time of attaching or detaching the wafer to or from the polishing head, so that before the wafer is attached to the carrier, which is the wafer attachment surface of the polishing head, the retainer ring engagement portion and the wafer support portion do not come into contact with each other. Thus, the wafer support portion continues to float until the wafer is attached to the carrier. That is, the positioning of the wafer is effected in a stable manner due to the floating effect.

In the aspect of the invention as claimed in claims 11 to 15, there is provided a cleaning mechanism for cleaning at least one of the polishing head and the wafer, so that before attaching the wafer to the polishing head, or before detaching it from the polishing head, it is possible to remove foreign matter from the lower portion of the polishing head and the lower surface of the carrier. Thus, it is possible to prevent defective adhesion between the wafer and the carrier due to foreign matter. Furthermore, damage to the wafer due to foreign matter can be prevented. Further, any foreign matter adhering to the lower surface of the wafer which has undergone polishing is removed by the cleaning mechanism. Thus, the wafer is supported on the wafer support portion in a stable manner. Further, the main body portion equipped with the cleaning mechanism is also swingable to the position below the polishing head to which no wafer is attached. And, by cleaning the polishing head to which no wafer is attached by means of the cleaning mechanism, it is always possible to prevent adhesion of foreign matter.

In the aspect of the invention as claimed in claims 16 and 17, the loading/unloading device of the present invention has at the upper end of the wafer support portion a second cleaning mechanism for cleaning the upper surface of the wafer detached from the polishing head, so that it is possible to clean both the upper and lower surfaces of the polished wafer. That is, since the upper surface of the wafer, which is the surface to which the robot arm for passing the wafer to the next step is attracted, is also cleaned, it is possible to prevent a deterioration in attracting force of the robot arm due to foreign matter. Further, it is possible to prevent damage to the wafer due to foreign matter.

In the aspect of the invention as claimed in claim 18, the wafer support portion is equipped with a wafer engagement portion for restricting horizontal movement of the supported wafer, so that the wafer is supported on the wafer support portion in a stable manner.

In the aspect of the invention as claimed, the unpolished wafer supported by the wafer support portion of a floating structure is attached to the polishing head accurately and reliably, being guided by the inner peripheral wall surface of the retainer ring engagement portion and the inner peripheral wall surface of the retainer ring. Further, the polishing head is cleaned by the cleaning mechanism and then the wafer is attached thereto, so that damage to the wafer is prevented and the attachment is effected in a stable manner.

In the aspect of the invention as claimed, the upper and lower surfaces of the wafer which has undergone the polishing process are cleaned before the wafer is passed to the next step, so that damage to the wafer is prevented. Further, the polishing head to which no wafer is attached is cleaned by cleaning solution ejected from the cleaning mechanism, and prevented from drying. Thus, foreign matter is prevented from sticking to the polishing head, and damage to the wafer at the time of attaching it to the polishing head is prevented.

What is claimed is:

1. A wafer loading/unloading device which attaches a wafer to a polishing head and receives the wafer from the polishing head, comprising:
   a swinging drive source;
   a swinging shaft rotated by the swinging drive source;
   an arm ascending/descending mechanism;
   a swinging arm supported by the swinging shaft such that the swinging arm swings horizontally, and supported by the arm ascending/descending mechanism such that the swinging arm can ascend and descend with the main body; and
   a main body portion having a circular configuration in plan view, the main body portion being configured to support the wafer, the main body portion being supported by the swinging arm, the main body portion being equipped with a generally disc shaped wafer support portion and an action force absorbing mechanism that absorbs vertical forces acting on the wafer support portion.

2. A wafer loading/unloading device according to claim 1, further comprising a floating mechanism supporting the wafer support portion such that the wafer support portion floats.

3. A wafer loading/unloading device according to claim 2, further comprising an engagement portion that restricts excessive movement of the wafer support portion in horizontal and vertical directions.

4. A wafer loading/unloading device according to claim 2, further comprising an annular retainer ring engagement portion which is provided above the wafer support portion and which is configured to engage with a retainer ring of the polishing head.

5. A wafer loading/unloading device according to claim 4, wherein a distance between the wafer support portion and the retainer ring engagement portion is set to be larger than a distance between an upper surface of the wafer when the wafer is attached to/detached from the polishing head and an attachment surface of the polishing head.

6. A wafer loading/unloading device according to claim 2, further comprising a cleaning mechanism which is provided proximate a center of the main body portion and which is adapted to clean at least one of the polishing head and the wafer.

7. A wafer loading/unloading device according to claim 1, further comprising an engagement portion that restricts excessive movement of the wafer support portion in horizontal and vertical directions.

8. A wafer loading/unloading device according to claim 7, further comprising a cleaning mechanism which is provided proximate a center of the main body portion and which is adapted to clean at least one of the polishing head and the wafer.

9. A wafer loading/unloading device according to claim 7, further comprising an annular retainer ring engagement portion which is provided above the wafer support portion and which is configured to engage with a retainer ring of the polishing head.

10. A wafer loading/unloading device according to claim 9, wherein a distance between the wafer support portion and the retainer ring engagement portion is set to be larger than a distance between an upper surface of the wafer when the wafer is attached to/detached from the polishing head and an attachment surface of the polishing head.

11. A wafer loading/unloading device according to claim 1, further comprising an annular retainer ring engagement portion which is provided above the wafer support portion and which is configured to engage with a retainer ring of the polishing head.

12. A wafer loading/unloading device according to claim 11, further comprising a cleaning mechanism which is provided proximate a center of the main body portion and which is adapted to clean at least one of the polishing head and the wafer.

13. A wafer loading/unloading device according to claim 11, wherein a distance between the wafer support portion and the retainer ring engagement portion is set to be larger than a distance between an upper surface of the wafer when the wafer is attached to/detached from the polishing head and an attachment surface of the polishing head.

14. A wafer loading/unloading device according to claim 13, further comprising a cleaning mechanism which is provided proximate a center of the main body portion and which is adapted to clean at least one of the polishing head and the wafer.

15. A wafer loading/unloading device according to claim 1, further comprising a cleaning mechanism which is provided proximate a center of the main body portion and which is adapted to clean at least one of the polishing head and the wafer.

16. A wafer loading/unloading device according to claim 15, further comprising a second cleaning mechanism which is provided at an upper end of the wafer support portion and which is adapted to clean an upper surface of the wafer detached from the polishing head.

17. A wafer loading/unloading device according to claim 1, further comprising a cleaning mechanism which is provided at an upper end of the wafer support portion and which is adapted to clean an upper surface of the wafer detached from the polishing head.

18. A wafer loading/unloading device according to claim 1, wherein the wafer support portion is equipped with a wafer engagement portion configured to restrict horizontal movement of the wafer.

* * * * *